(12) United States Patent
Maeda et al.

(10) Patent No.: US 10,262,879 B2
(45) Date of Patent: Apr. 16, 2019

(54) MOLD DEVICE

(71) Applicant: Toshiba Memory Corporation, Minato-ku (JP)

(72) Inventors: Takeori Maeda, Mie (JP); Ryoji Matsushima, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 263 days.

(21) Appl. No.: 15/414,165

(22) Filed: Jan. 24, 2017

(65) Prior Publication Data
US 2017/0263476 A1 Sep. 14, 2017

(30) Foreign Application Priority Data

Mar. 11, 2016 (JP) ................. 2016-048829

(51) Int. Cl.
*H01L 21/67* (2006.01)
*B29C 45/14* (2006.01)
*B29C 45/34* (2006.01)
*B29L 31/34* (2006.01)
*B29C 45/02* (2006.01)

(52) U.S. Cl.
CPC .. *H01L 21/67126* (2013.01); *B29C 45/14065* (2013.01); *B29C 45/14655* (2013.01); *B29C 45/34* (2013.01); *B29C 45/02* (2013.01); *B29L 2031/3406* (2013.01)

(58) Field of Classification Search
CPC ......... H01L 21/67126; B29C 45/14655; B29C 45/34
See application file for complete search history.

(56) References Cited

U.S. PATENT DOCUMENTS 6,676,885 B2 1/2004 Shimizu et al.
2003/0129272 A1* 7/2003 Shen ................... B29C 45/0046
425/123
(Continued)

FOREIGN PATENT DOCUMENTS

JP 2001-223229 A 8/2001
JP 2014-172287 A 9/2014
(Continued)

*Primary Examiner* — Robert B Davis
(74) *Attorney, Agent, or Firm* — Oblon, McClelland, Maier & Neustadt, L.L.P.

(57) ABSTRACT

According to one embodiment, a mold device includes a first mold. The first mold includes a substrate clamping surface, a cavity, a suction part, a vent, first and second intermediate cavities and an opening/closing part. The substrate clamping surface contacts a surface of a processing substrate. The cavity is recessed from the substrate clamping surface. The suction part is recessed from the substrate clamping surface. The vent is provided on a path between the cavity and the suction part, and is recessed from the substrate clamping surface to a vent depth. The first intermediate cavity is provided between the vent and the suction part, and is recessed from the substrate clamping surface. The second intermediate cavity is provided between the first intermediate cavity and the suction part, and is recessed from the substrate clamping surface to a second intermediate cavity depth. The opening/closing part opens and closes the path.

13 Claims, 9 Drawing Sheets

(56) References Cited

U.S. PATENT DOCUMENTS

| | | | |
|---|---|---|---|
| 2004/0166605 A1* | 8/2004 | Kuratomi | H01L 21/565 438/106 |
| 2009/0115098 A1* | 5/2009 | De Vries | B29C 45/14655 264/272.13 |
| 2012/0187598 A1 | 7/2012 | Lee et al. | |
| 2013/0028998 A1 | 1/2013 | Maekawa et al. | |
| 2016/0240396 A1* | 8/2016 | Cheon | B29C 45/34 |
| 2017/0271186 A1 | 9/2017 | Maeda et al. | |
| 2018/0254198 A1* | 9/2018 | Maeda | H01L 21/565 |

FOREIGN PATENT DOCUMENTS

| | | |
|---|---|---|
| JP | 2015-520 A | 1/2015 |
| JP | 2015-5611 A | 1/2015 |
| JP | 2017-164987 A | 9/2017 |
| TW | 201438869 A | 10/2014 |
| TW | 201446458 A | 12/2014 |
| TW | 201501217 A | 1/2015 |
| WO | WO 2014/199733 A1 | 12/2014 |
| WO | WO 2013/069496 A1 | 4/2015 |

* cited by examiner

MOLD DEVICE

CROSS-REFERENCE TO RELATED APPLICATIONS

This application is based upon and claims the benefit of priority from Japanese Patent Application No. 2016-048829, filed on Mar. 11, 2016; the entire contents of which are incorporated herein by reference.

FIELD

Embodiments described herein relate generally to a mold device.

BACKGROUND

There is a semiconductor device or the like in which multiple stacked semiconductor elements are sealed with a resin, etc. For example, such a semiconductor device is manufactured by a transfer molding apparatus using molds. For example, molding defects occur if the resin is not filled appropriately. A mold device that has good moldability is desirable.

DETAILED DESCRIPTION

Figure 1:
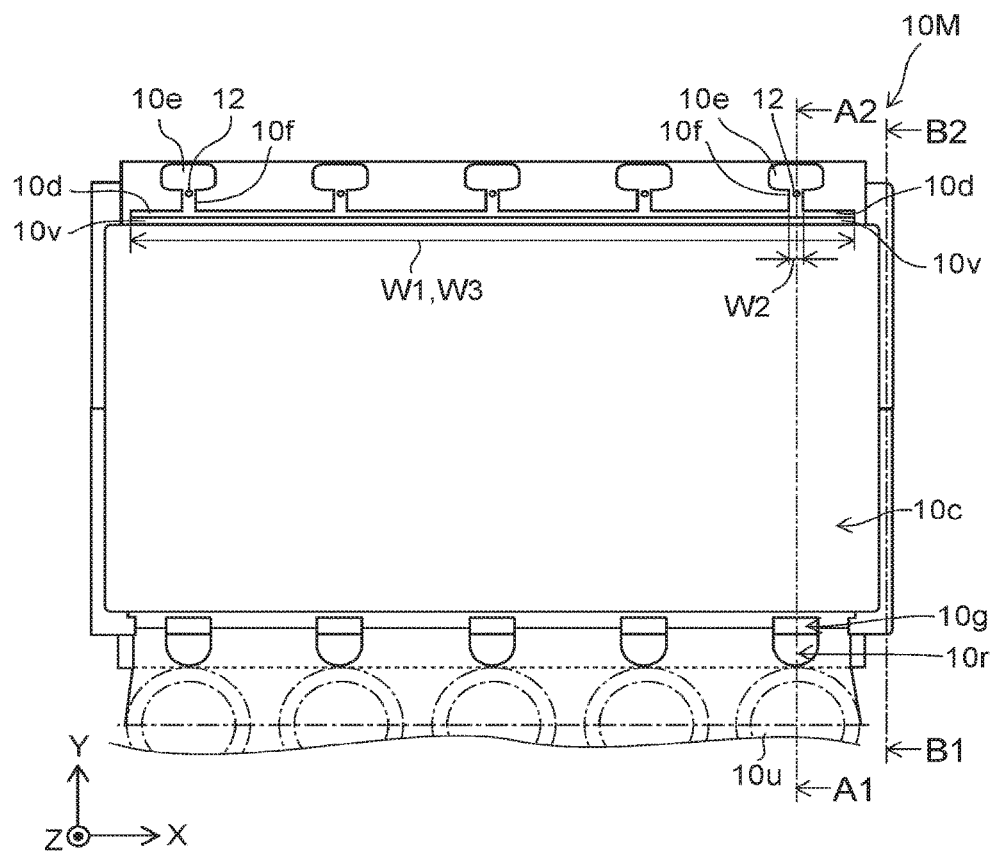
FIG. 1 is a schematic plan view illustrating a mold device according to an embodiment.

According to one embodiment, a mold device includes a first mold. The first mold includes a substrate clamping surface, a cavity, a suction part, a vent, a first intermediate cavity, a second intermediate cavity and an opening/closing part. The substrate clamping surface contacts a surface of a processing substrate. The cavity is recessed from the substrate clamping surface. The suction part is recessed from the substrate clamping surface. The vent is provided on a path between the cavity and the suction part, communicates with the cavity, is recessed from the substrate clamping surface to a vent depth, and is used as an exhaust path of a gas inside the cavity. The first intermediate cavity is provided between the vent and the suction part on the path, communicates with the vent, is recessed from the substrate clamping surface, and has a first width in a direction along the substrate clamping surface and perpendicular to a line segment corresponding to a shortest path connecting the suction part and the cavity. The second intermediate cavity is provided between the first intermediate cavity and the suction part on the path, communicates with the first intermediate cavity, is recessed from the substrate clamping surface to a second intermediate cavity depth, and has a second width in the direction along the substrate clamping surface and perpendicular to the line segment corresponding to the shortest path connecting the suction part and the cavity. The second intermediate cavity depth is deeper than the vent depth. The second width is narrower than the first width. The opening/closing part opens and closes the path and is provided between the second intermediate cavity and the suction part on the path.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

FIG. 1 is a schematic plan view illustrating a mold device according to an embodiment.

Figure 2A:
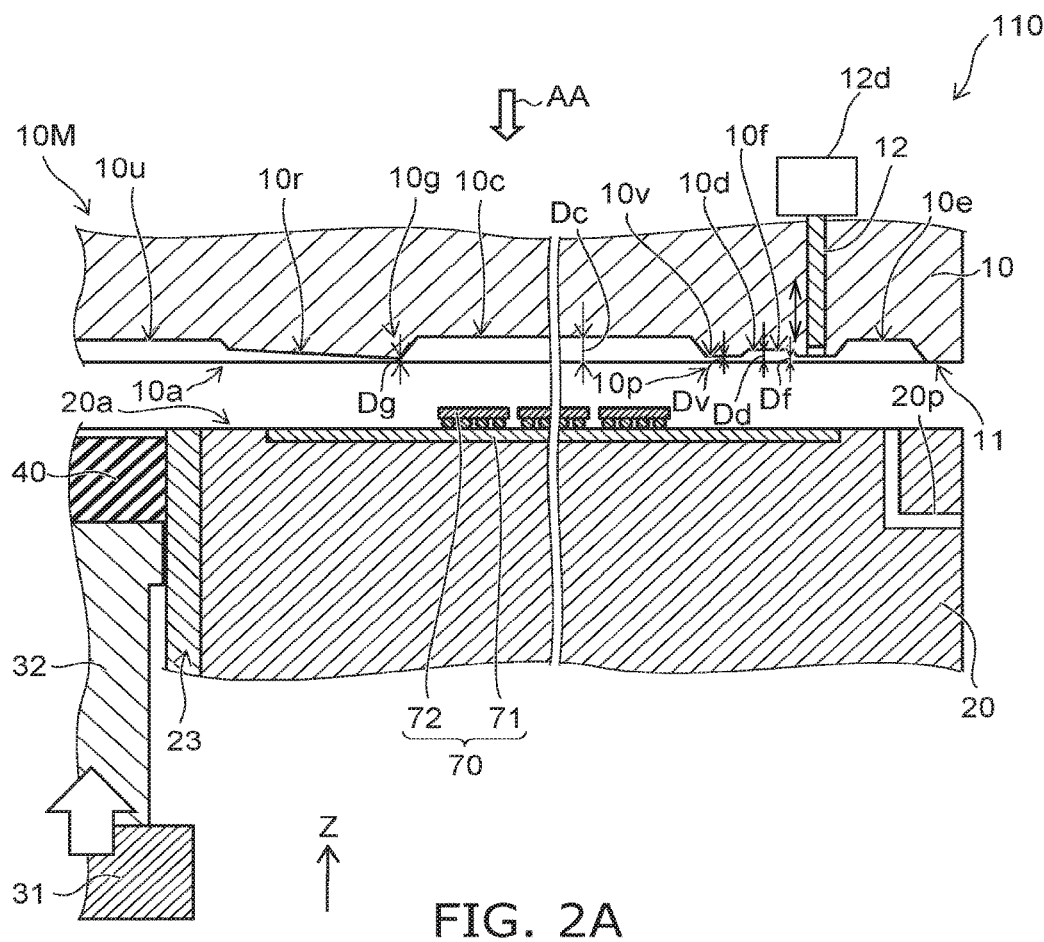
FIG. 2A and FIG. 2B are schematic cross-sectional views illustrating the mold device and the transfer molding apparatus according to the embodiment.
Figure 2B:
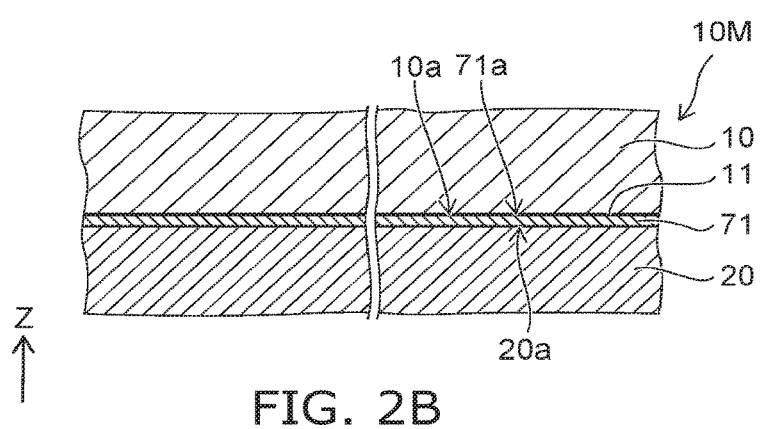

FIG. 2A and FIG. 2B are schematic cross-sectional views illustrating the mold device and the transfer molding apparatus according to the embodiment.

FIG. 1 is a plan view as viewed along arrow AA of FIG. 2A. FIG. 2A is a cross-sectional view corresponding to a line A1-A2 cross section of FIG. 1. FIG. 2B is a cross-sectional view corresponding to a line B1-B2 cross section of FIG. 1.

As shown in FIG. 2A, the mold device 10M according to the embodiment includes a first mold 10 and a second mold 20. A major surface 10a of the first mold 10 is disposed to oppose a major surface 20a of the second mold 20. FIG. 2A shows an example of a state in which the two molds are separated from each other.

In the example, a processing substrate 71 of a processing object 70 is disposed on the major surface 20a of the second mold 20. For example, a semiconductor chip 72 is provided on the processing substrate 71. The processing substrate 71 and the semiconductor chip 72 are a portion of the semiconductor device to be manufactured.

In the embodiment, the processing substrate 71 may be disposed on the first mold 10; and the second mold 20 may be disposed on the processing substrate 71. In the embodiment, it is possible to interchange the position of the first mold 10 and the position of the second mold 20.

A direction from the second mold 20 toward the first mold 10 is taken as a Z-axis direction. One direction perpendicular to the Z-axis direction is taken as an X-axis direction. A direction perpendicular to the Z-axis direction and the X-axis direction is taken as a Y-axis direction.

The processing substrate 71 is disposed between the two molds; and in the state in which the two molds are closed, for example, the surface of the substrate clamping part contacts the processing substrate 71.

FIG. 2B shows the state in which the two molds are closed.

As shown in FIG. 2A and FIG. 2B, the first mold 10 has a substrate clamping surface 11 (the surface of the substrate clamping part). As shown in FIG. 2B, the substrate clamping surface 11 contacts a surface 71a of the processing substrate 71 when the processing substrate 71 (the processing object 70) is disposed between the first mold 10 and the second mold 20. The processing substrate 71 is clamped by the substrate clamping surface 11 and the surface (the major surface 20a) of the second mold 20.

As shown in FIG. 2A, recesses are provided in the major surface 10a of the first mold 10. A resin 40 is introduced to the recesses. The semiconductor device is made by the resin being formed into a configuration corresponding to the configurations of the recesses.

In the example, a cull 10u, a runner 10r, a gate 10g, a cavity 10c, a vent 10v, a first intermediate cavity 10d, a second intermediate cavity 10f, and a suction part 10e are provided as the recesses. These parts are regions recessed from the flat portion (the substrate clamping surface 11) of the major surface 10a of the first mold 10. These parts communicate with each other.

In the example, an opening/closing part 12 is provided in the first mold 10. The opening/closing part 12 is, for example, a shut-off pin. A driving part 12d that operates the opening/closing part 12 is provided. For example, a state in which the recesses communicate with the outside and a state in which the recesses do not communicate with the outside are formed by the operation of the opening/closing part 12 by the driving part 12d.

The suction part 10e communicates with one end of a suction path 20p. Another end of the suction path 20p communicates with a depressurizing apparatus (e.g., a not-illustrated evacuation pump, etc.).

The processing object 70 is disposed between the two molds; the molds are caused to approach each other; and the molds are set so that portions of the two molds contact each other. For example, when the opening/closing part 12 is in the open state, the gas (e.g., the air and the outgas from the resin 40) that is inside the cavity 10c is exhausted via the vent 10v, the first intermediate cavity 10d, the second intermediate cavity 10f, the suction part 10e, and the suction path 20p. The suction part 10e is, for example, a gas suction part. The resin 40 is introduced to the cavity 10c having the gas exhausted from the interior of the cavity 10c. In the example, the suction path 20p is provided in the second mold 20. In the embodiment, the suction path 20p may be provided in the first mold 10.

The resin 40 is introduced via a pot 23 provided in the mold device 10M. In the example, the pot 23 is provided in the second mold 20. In the embodiment, the pot 23 may be provided in the first mold 10. The resin 40 is filled from the pot 23.

In the embodiment, a transfer molding apparatus 110 includes the mold device 10M and a transfer part 31. A plunger 32 is provided in the example. Also, a not-illustrated controller may be provided. For example, the controller controls the exhaust of the gas from the space inside the mold device 10M via the suction part 10e and controls the introduction of the resin 40 to the space inside the mold device 10M based on the operation of the transfer part 31.

At least a portion of the pot 23 has, for example, a tubular configuration. The plunger 32 is disposed in the interior of the pot 23. The resin 40 is disposed at an end part of the plunger 32. For example, the transfer part 31 is movable vertically (along the Z-axis direction). By the movement of the transfer part 31, the plunger 32 moves; and the resin 40 is supplied to the interior of the mold device 10M (i.e., between the first mold 10 and the second mold 20).

For example, the resin 40 is introduced to the cull 10u when the opening/closing part 12 is in the open state. The resin 40 that passes through the cull 10u passes through the runner 10r and reaches the gate 10g. Subsequently, the resin 40 is introduced to the cavity 10c. For example, the opening/closing part 12 is set to the closed state when the resin 40 passes through the vent 10v and reaches the first intermediate cavity 10d and the second intermediate cavity 10f. The cavity 10c, the vent 10v, the first intermediate cavity 10d, and the second intermediate cavity 10f become a substantially sealed space; and the resin 40 is filled into these parts at a high pressure. Here, a substantially sealed space means that the gaps and the like between the opening/closing part 12 and the first mold 10 necessary for the opening/closing part 12 to be movable are allowable; and the micro spaces between the parts of the mold device 10M are allowable.

Thus, the mold device 10M (in the example, the first mold 10) according to the embodiment includes the substrate clamping surface 11, the cavity 10c, the suction part 10e, the vent 10v, the first intermediate cavity 10d, the second intermediate cavity 10f, and the opening/closing part 12. The substrate clamping surface 11 contacts the surface 71a of the processing substrate 71 (referring to FIG. 2B). The cavity 10c is recessed from the substrate clamping surface 11 (referring to FIG. 2A). The suction part 10e is recessed from the substrate clamping surface 11 (referring to FIG. 2A).

The vent 10v is provided on a path 10p between the cavity 10c and the suction part 10e (referring to FIG. 1 and FIG. 2A). The vent 10v communicates with the cavity 10c and is used as an exhaust path of the gas inside the cavity 10c. The cavity 10c is recessed to a cavity depth Dc from the substrate clamping surface 11 (referring to FIG. 2A).

The first intermediate cavity 10d is provided between the vent 10v and the suction part 10e on the path 10p (referring to FIG. 1 and FIG. 2A). The first intermediate cavity 10d communicates with the vent 10v; and the first intermediate cavity 10d is recessed from the substrate clamping surface 11. The first intermediate cavity 10d has a first width W1 (referring to FIG. 1). The first width W1 is the width in a direction (one direction in the X-Y plane) along the substrate clamping surface 11 and perpendicular to a line segment corresponding to the shortest path connecting the suction part 10e and the cavity 10c. In the example, the first width W1 is the length in the X-axis direction. The first intermediate cavity 10d is recessed from the substrate clamping surface 11 to a first intermediate cavity depth Dd (referring to FIG. 2A). In the example, the first intermediate cavity depth Dd is deeper than a vent depth Dv.

The second intermediate cavity 10f is provided between the first intermediate cavity 10d and the suction part 10e on the path 10p (referring to FIG. 1 and FIG. 2A). The second intermediate cavity 10f communicates with the first intermediate cavity 10d. The second intermediate cavity 10f is recessed from the substrate clamping surface 11. The second intermediate cavity 10f has a second width W2 (referring to FIG. 1). The second width W2 is the width in a direction (one direction in the X-Y plane) along the substrate clamping surface 11 and perpendicular to the line segment corresponding to the shortest path connecting the suction part 10e and the cavity 10c. In the example, the second width W2 is the length in the X-axis direction. In the embodiment, the second width W2 is narrower than the first width W1. The second intermediate cavity 10f is recessed from the substrate clamping surface 11 to a second intermediate cavity depth Df. The second intermediate cavity depth Df is deeper than the vent depth Dv (referring to FIG. 2A).

The opening/closing part 12 (e.g., the shut-off pin) is provided between the second intermediate cavity 10f and the suction part 10e on the path 10p. For example, the opening/closing part 12 performs at least one of a vertical operation or a rotation operation. Thereby, the opening/closing part 12 is able to open and close the communicating portion between the second intermediate cavity 10f and the suction part 10e.

For example, there is a first reference example in which a shallow vent 10v is provided; but the deep intermediate cavities recited above are not provide. In the first reference example, the opening/closing part 12 is set to the open state; the resin 40 is introduced to the cavity 10c of the mold device 10M; the opening/closing part 12 is set to the closed state after the resin 40 passes through the vent 10v; and a high pressure is applied to the resin 40. In the case where the timing of switching the opening/closing part 12 from the open state to the closed state is inappropriate, for example, unfilled portions of the resin 40 or leaking of the resin 40 occurs. In the reference example, there are cases where the moldability is insufficient.

Conversely, the intermediate cavities (the first intermediate cavity 10d and the second intermediate cavity 10f) are provided in the embodiment. For example, the second intermediate cavity depth Df is set to be deeper than the vent depth Dv. Thereby, for example, the velocity of the resin 40 passing through the vent 10v becomes slower in the second intermediate cavity 10f. Thereby, the margin of the timing of switching the opening/closing part 12 to obtain the appropriate molding state is enlarged. For example, the unfilled portions of the resin 40 and the leaking of the resin 40 can be suppressed. According to the embodiment, a mold device that has good moldability can be provided.

In the first reference example in which the shallow vent 10v is provided but the first intermediate cavity 10d and the second intermediate cavity 10f such as those recited above are not provided, the cross-sectional area of the path in the shallow vent 10v is small; therefore, there are cases where the depressurization inside the cavity 10c via the vent 10v is insufficient. For example, local exhaust of the cavity 10c may occur easily. For example, there are cases where the gas exhaust is insufficient at positions inside the cavity 10c. Therefore, there are cases where the fillability of the resin 40 into the cavity 10c degrades at portions.

On the other hand, there is a second reference example in which the shallow vent 10v is provided; but one of the two types of intermediate cavities (e.g., the second intermediate cavity 10f having the narrow width) is not provided. Because the width of the intermediate cavity is narrow, for example, local exhaust occurs easily; and there are cases where the gas exhaust is insufficient at positions inside the cavity 10c. Therefore, there are cases where the fillability of the resin 40 into the cavity 10c degrades at portions.

In the embodiment, the first intermediate cavity 10d that has a wide width and the second intermediate cavity 10f that has a narrow width are provided in addition to the shallow vent 10v. The air pressure of the interior of the first intermediate cavity 10d having the wide width becomes uniform easily in the plane. Thereby, uniform gas exhaust of the interior of the cavity 10c is easy. Thereby, the fillability in the plane can be uniform and good. According to the embodiment, a mold device that has good moldability can be provided.

In the embodiment, for example, it is favorable for the second width W2 to be not less than 1/100 times and not more than 1/5 times the first width W1. In the case where the second width W2 is less than 1/100 times, the second width W2 becomes excessively narrow; and, for example, the gas exhaust is difficult. When the second width W2 exceeds 1/5 times, the second width W2 becomes excessively wide; and, for example, leaking of the resin occurs easily.

In the embodiment, it is favorable for the first intermediate cavity depth Dd of the first intermediate cavity 10d to be deeper than the vent depth Dv. Thereby, for example, the velocity of the resin 40 passing through the vent 10v becomes slower in the second intermediate cavity 10f. Thereby, the margin of the timing of switching the opening/closing part 12 to obtain the appropriate molding state is enlarged. For example, the unfilled portions of the resin 40 and the leaking of the resin 40 can be suppressed.

In the embodiment, it is favorable for a third width W3 of the vent 10v (referring to FIG. 2A) to be wider than the second width W2 of the second intermediate cavity 10f. The third width W3 is the width in a direction (one direction in the X-Y plane) along the substrate clamping surface 11 and perpendicular to the line segment corresponding to the shortest path connecting the suction part 10e and the cavity 10c. In the example, the third width W3 is the length in the X-axis direction. The gas exhaust from the cavity 10c is performed efficiently by setting the third width W3 to be wider than the second width W2. For example, the third width W3 may be substantially the same as the first width W1.

In the embodiment, for example, it is favorable for the second width W2 to be not less than 1/100 times and not more than 1/5 times the third width W3. In the case where the second width W2 is less than 1/100 times, the second width W2 becomes excessively narrow; and, for example, the gas exhaust is difficult. When the second width W2 exceeds 1/5 times, the second width W2 becomes excessively wide; and, for example, the leaking of the resin occurs easily.

In the embodiment, in the case where the gate 10g is provided, the gate 10g is deeper than the depth of the vent 10v. In other words, the mold device 10M (the first mold 10) further includes the gate 10g recessed from the substrate clamping surface 11 to a gate depth Dg (referring to FIG. 2A). The cavity 10c is provided in at least a portion between the gate 10g and the vent 10v. The vent depth Dv is shallower than the gate depth Dg.

An example of the operation of the transfer molding apparatus 110 will now be described.

FIG. 3 to FIG. 7 are schematic cross-sectional views in order of the processes, illustrating the operation of the transfer molding apparatus using the mold device according to the embodiment.

Figure 3:
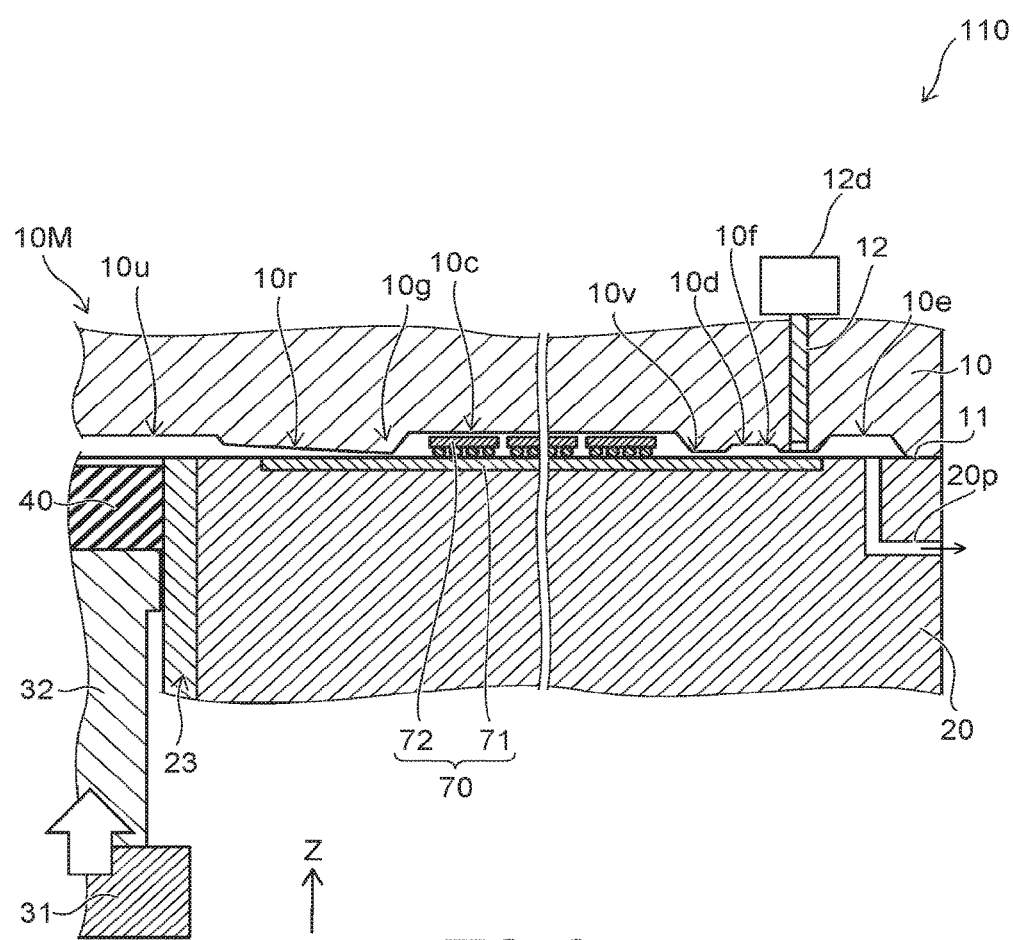
FIG. 3 is a schematic cross-sectional view in order of the processes, illustrating the operation of the transfer molding apparatus using the mold device according to the embodiment.

As shown in FIG. 3, the processing object 70 is disposed between the first mold 10 and the second mold 20; and these molds are closed. Then, the space between these molds is depressurized.

Figure 4:
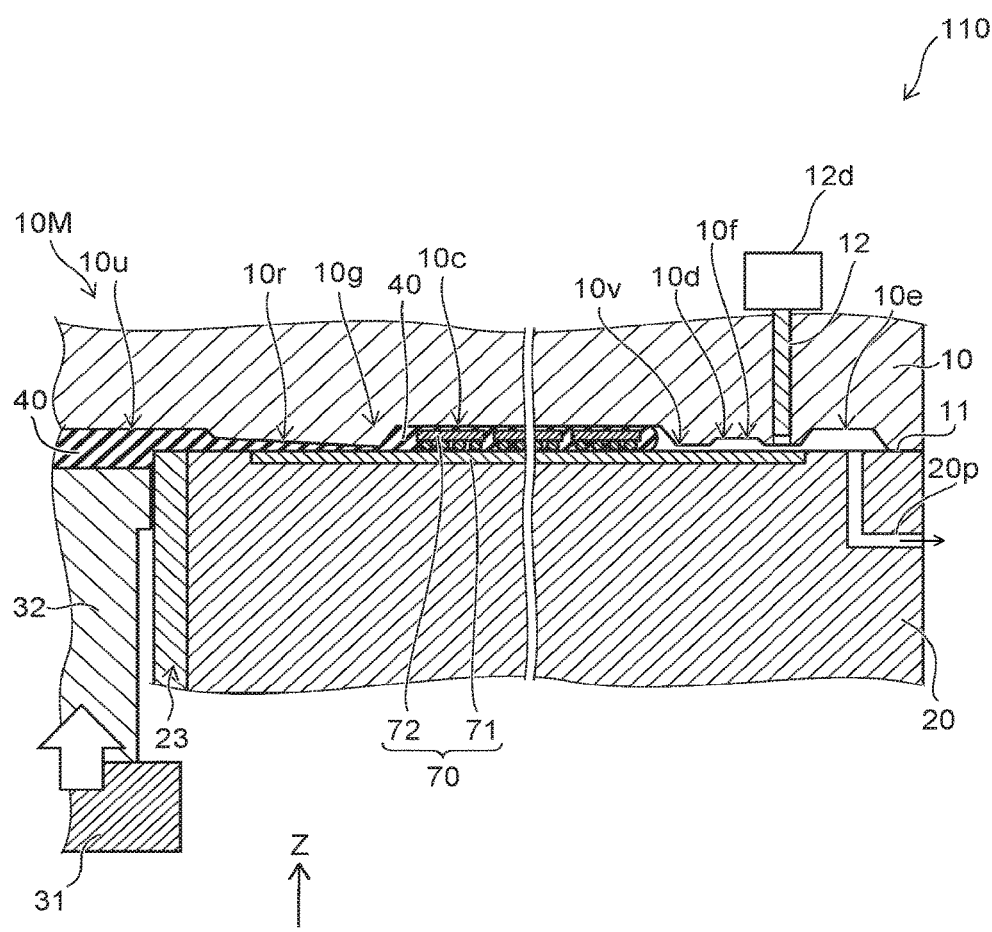
FIG. 4 is a schematic cross-sectional view in order of the processes, illustrating the operation of the transfer molding apparatus using the mold device according to the embodiment.

As shown in FIG. 4, the plunger 32 is moved upward by driving the transfer part 31. Thereby, the resin 40 is supplied to the interior of the cavity 10c.

Figure 5:
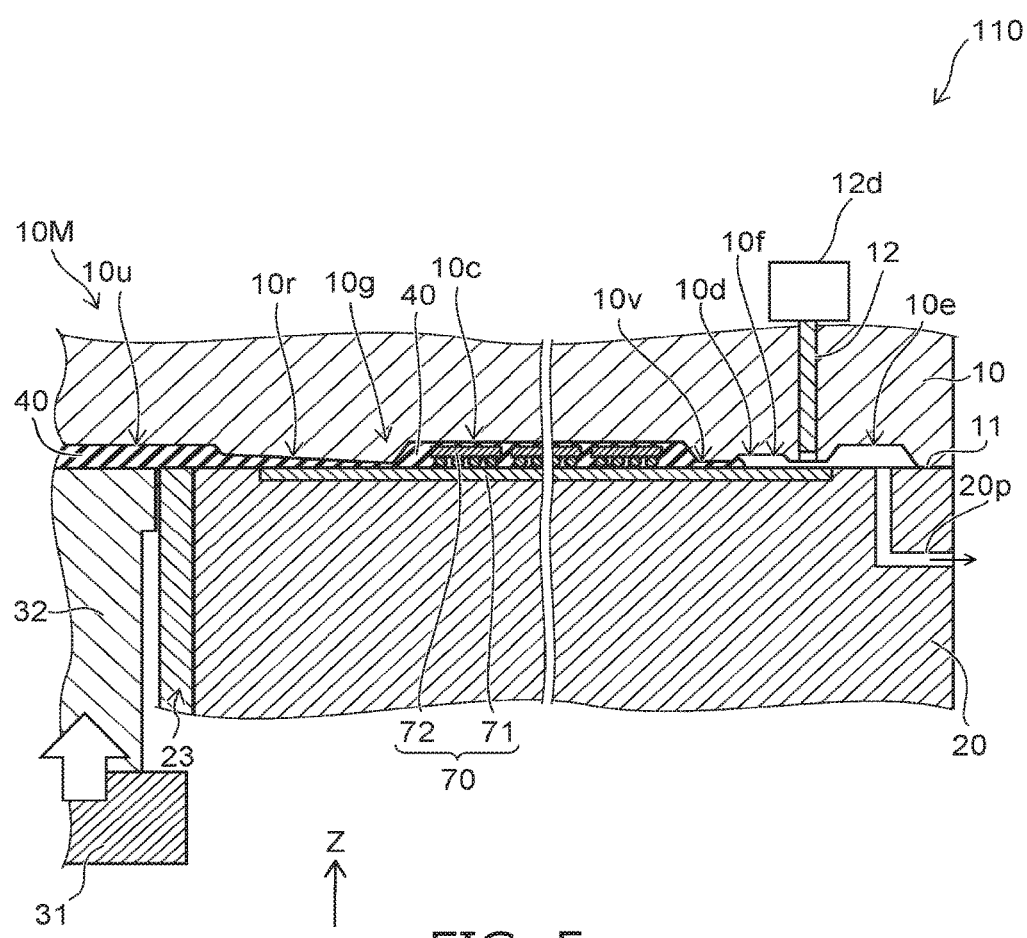
FIG. 5 is a schematic cross-sectional view in order of the processes, illustrating the operation of the transfer molding apparatus using the mold device according to the embodiment.

As shown in FIG. 5, the resin 40 passes through the cavity 10c and the vent 10v and reaches the first intermediate cavity 10d. Further, the resin 40 reaches the second intermediate cavity 10f.

Figure 6:
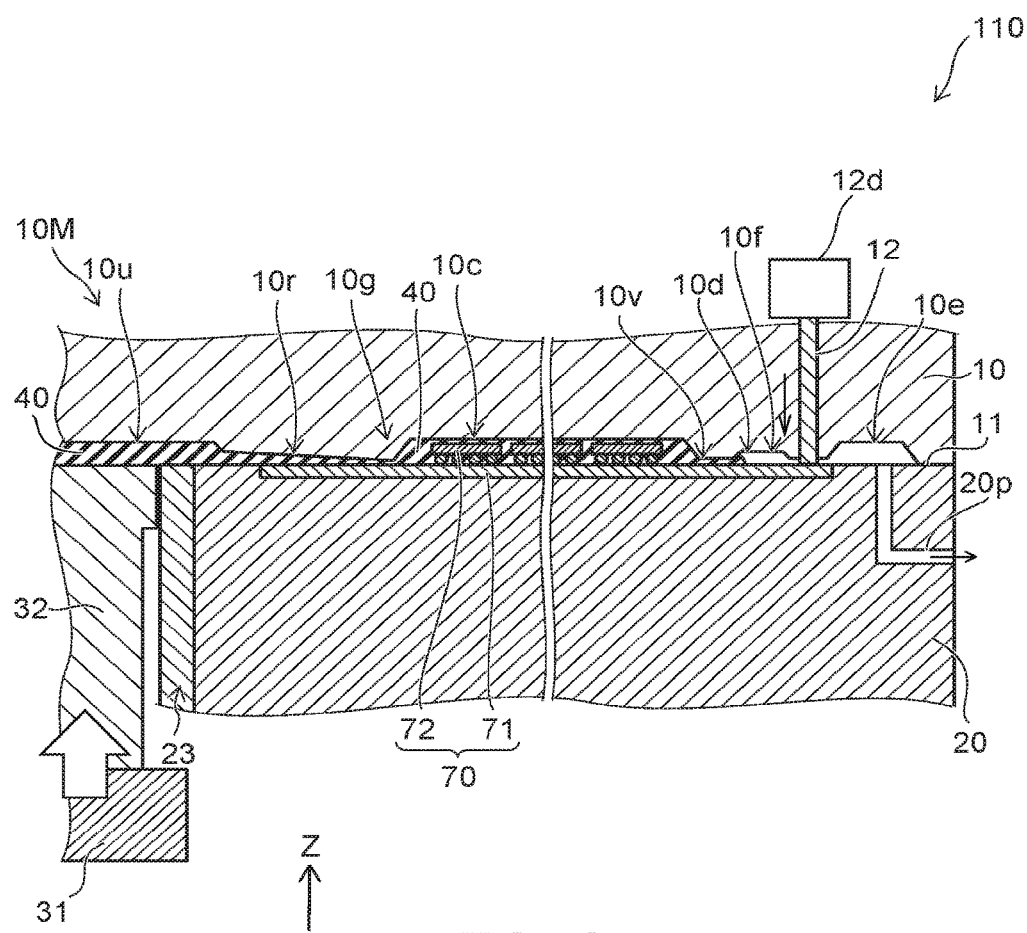
FIG. 6 is a schematic cross-sectional view in order of the processes, illustrating the operation of the transfer molding apparatus using the mold device according to the embodiment.

As shown in FIG. 6, this state is detected; and the opening/closing part 12 (the shut-off pin) is switched to the closed state.

Figure 7:
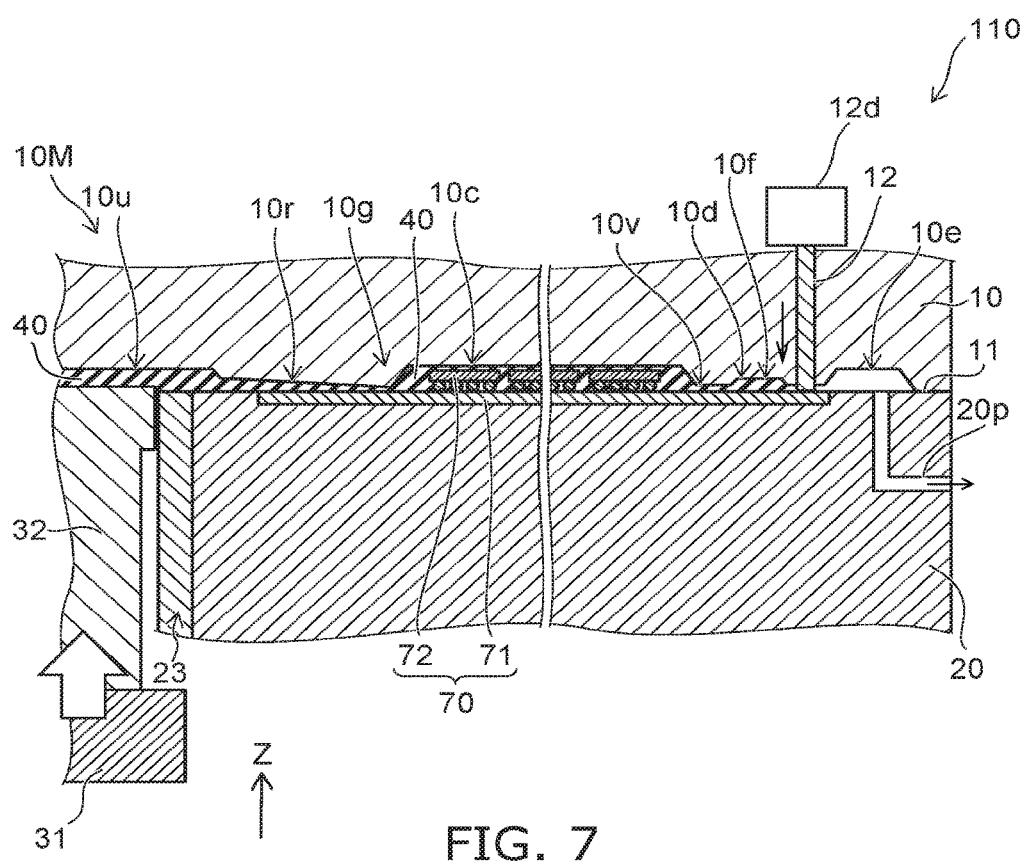
FIG. 7 is a schematic cross-sectional view in order of the processes, illustrating the operation of the transfer molding apparatus using the mold device according to the embodiment.

As shown in FIG. 7, when the opening/closing part 12 is in the closed state, the resin 40 is further supplied. The resin 40 is filled into the second intermediate cavity 10f. The resin 40 is thermally cured while applying a high filling pressure.

For example, to reduce the cost, it may be considered to eliminate the under-fill resin filled into the gaps between the chip stacks including TSV, and to perform collective filling using the mold resin. For example, there is a method in which the resin is filled while depressurizing the interior of the cavities of the mold device and by operating the shut-off pin directly before the filling completion. However, in the case where the viscosity of the resin is reduced to fill the narrow gaps, even when using such a method, resin leakage or unfilled portions occur easily. In the embodiment, by providing the portion (the vent 10v) that dams the resin in front of the shut-off pin, the operation of the shut-off pin can be delayed. Also, by providing the first intermediate cavity 10d and the second intermediate cavity 10f between the vent 10v and the shut-off pin, the margin of the timing of operating the shut-off pin can be widened. By providing the first intermediate cavity 10d that has the wide width and the second intermediate cavity 10f that has the narrow width, uniform gas exhaust of the interior of the cavity 10c is easy. Thereby, the fillability in the plane can be uniform and good.

Figure 8:
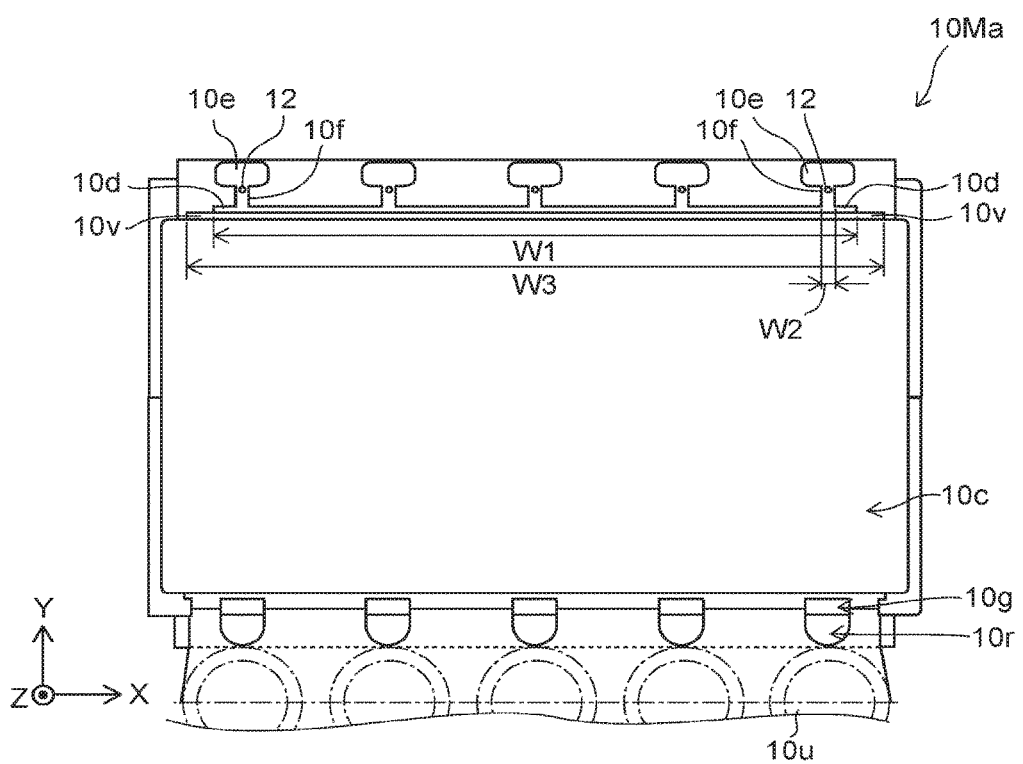
FIG. 8 is a schematic plan view illustrating a mold device according to the embodiment.

FIG. 8 is a schematic plan view illustrating a mold device according to the embodiment.

As shown in FIG. 8, the first intermediate cavity 10d, the second intermediate cavity 10f, the suction part 10e, and the opening/closing part 12 are provided in another mold device 10Ma according to the embodiment as well. In the mold device 10Ma, the third width W3 is wider than the first width W1. Otherwise, the mold device 10Ma is similar to the mold device 10M. In the mold device 10Ma as well, the second width W2 is narrower than the first width W1. Good moldability is obtained in the mold device 10Ma as well.

Figure 9:
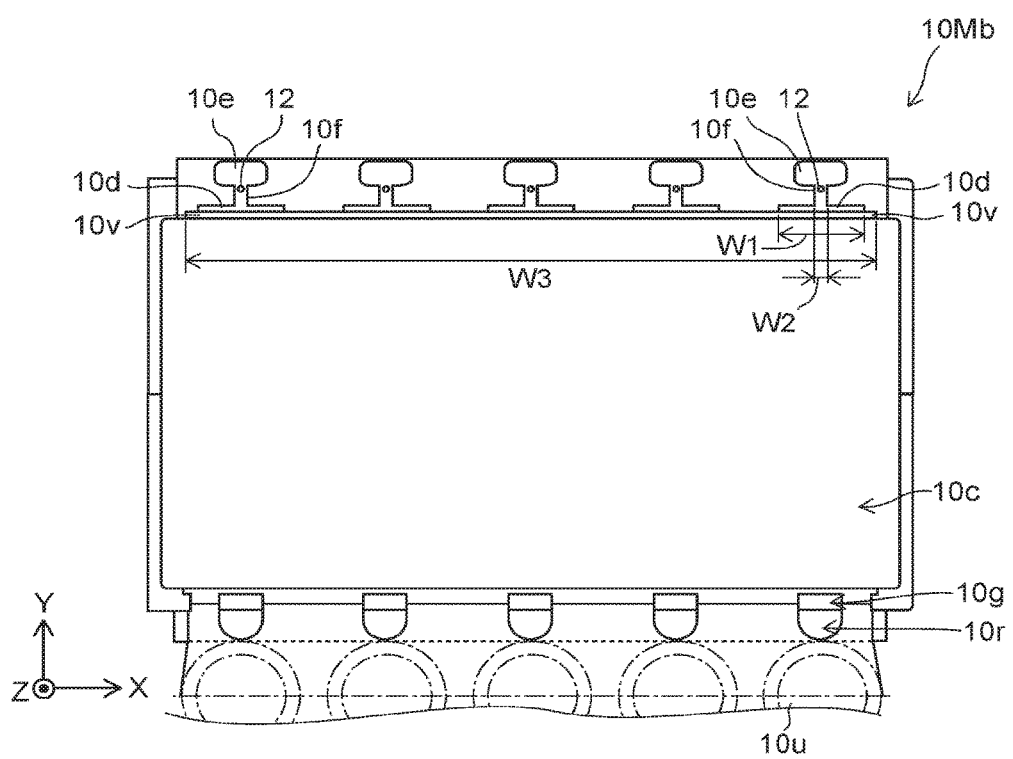
FIG. 9 is a schematic plan view illustrating a mold device according to the embodiment.

FIG. 9 is a schematic plan view illustrating a mold device according to the embodiment.

As shown in FIG. 9, the first intermediate cavity 10d, the second intermediate cavity 10f, the suction part 10e, and the opening/closing part 12 are provided in another mold device 10Mb according to the embodiment as well. In the mold device 10Mb, the multiple suction parts 10e and the multiple second intermediate cavities 10f are provided for one cavity 10c. The first intermediate cavity 10d is provided in each of the multiple second intermediate cavities 10f. In the mold device 10Mb as well, the third width W3 is wider than the first width W1. Otherwise, the mold device 10Mb is similar to the mold device 10M. In the mold device 10Mb as well, the second width W2 is narrower than the first width W1. Good moldability is obtained in the mold device 10Mb as well.

In the mold devices 10M, 10Ma, and 10Mb recited above, the widths may increase in the direction from the second intermediate cavity 10f toward the first intermediate cavity 10d. The widths may increase continuously.

According to the embodiments, a mold device that has good moldability can be provided.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in mold devices such as cavities, vents, intermediate cavities, suction parts, substrate clamping parts, opening/closing parts, and included in transfer molding apparatus such as transfer parts, sensor parts, and controllers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all mold devices practicable by an appropriate design modification by one skilled in the art based on the mold devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A mold device, comprising
a first mold including:
a substrate clamping surface contacting a surface of a processing substrate;
a cavity recessed from the substrate clamping surface;
a suction part recessed from the substrate clamping surface;
a vent being provided on a path between the cavity and the suction part, communicating with the cavity, being recessed from the substrate clamping surface to a vent depth, and being used as an exhaust path of a gas inside the cavity;
a first intermediate cavity being provided between the vent and the suction part on the path, communicating with the vent, being recessed from the substrate clamping surface, and having a first width in a direction along the substrate clamping surface and perpendicular to a line segment corresponding to a shortest path connecting the suction part and the cavity;
a second intermediate cavity being provided between the first intermediate cavity and the suction part on the path, communicating with the first intermediate cavity, being recessed from the substrate clamping surface to a second intermediate cavity depth, and having a second width in the direction along the substrate clamping surface and perpendicular to the line segment corresponding to the shortest path connecting the suction part and the cavity, the second intermediate cavity depth being deeper than the vent depth, the second width being narrower than the first width; and
an opening/closing part opening and closing the path and being provided between the second intermediate cavity and the suction part on the path.

2. The device according to claim 1, wherein the first intermediate cavity is recessed from the substrate clamping surface to a first intermediate cavity depth deeper than the vent depth.

3. The device according to claim 1, wherein
the vent has a third width in the direction along the substrate clamping surface and perpendicular to the line segment corresponding to the shortest path connecting the suction part and the cavity, and
the third width is wider than the second width.

4. The device according to claim 3, wherein the second width is not less than 1/100 times and not more than 1/5 times the third width.

5. The device according to claim 1, wherein
the vent has a third width in the direction along the substrate clamping surface and perpendicular to the line segment corresponding to the shortest path connecting the suction part and the cavity, and
the third width is wider than the first width.

6. The device according to claim 1, wherein the second width is not less than 1/100 times and not more than 1/5 times the first width.

7. The device according to claim 1, wherein
the first mold further includes a gate, and
the gate is recessed from the substrate clamping surface.

8. The device according to claim 7, wherein
the gate is recessed to a gate depth from the substrate clamping surface, and
the vent depth is shallower than the gate depth.

9. The device according to claim 1, further comprising a second mold,
the second mold opposing the substrate clamping surface.

10. The device according to claim 9, wherein the substrate clamping surface is able to contact the processing substrate disposed between the first mold and the second mold.

11. The device according to claim 1, wherein the opening/closing part includes a shut-off pin.

12. The device according to claim 1, wherein the opening/closing part performs at least one of a vertical operation or a rotation operation.

13. The device according to claim 1, wherein the opening/closing part is able to open and close a communicating portion between the second intermediate cavity and the suction part.

* * * * *